United States Patent [19]
Nishizato et al.

[11] Patent Number: 5,520,969
[45] Date of Patent: May 28, 1996

[54] METHOD FOR IN-SITU LIQUID FLOW RATE ESTIMATION AND VERIFICATION

[75] Inventors: Hiroshi Nishizato, Kumamoto, Japan; Visweswaren Sivaramakrishnan, Cupertino; Jun Zhao, Milpitas, both of Calif.

[73] Assignee: Applied Materials, Inc., Santa Clara, Calif.

[21] Appl. No.: 191,977

[22] Filed: Feb. 4, 1994

[51] Int. Cl.$^6$ ............................ C23C 16/00; G01F 1/34; G01F 7/00
[52] U.S. Cl. ................... 427/8; 427/248.1; 427/255.1; 73/196; 73/199; 73/861.42; 73/861.49
[58] Field of Search .................. 427/8, 248.1, 255.1, 427/561, 569, 582, 585; 364/510, 500; 73/196, 199, 861.42, 861.49

[56] References Cited

U.S. PATENT DOCUMENTS

| | | | |
|---|---|---|---|
| 3,708,658 | 1/1973 | Hopkins | 364/500 |
| 4,439,463 | 3/1984 | Miller | 427/488 |
| 4,517,220 | 5/1985 | Rose | 427/8 |
| 4,542,650 | 9/1985 | Renken et al. | 73/196 |
| 4,671,097 | 6/1987 | Kurki et al. | 364/510 |
| 4,989,160 | 1/1991 | Garrett et al. | 364/509 |
| 5,114,752 | 5/1992 | Hall | 427/273 |
| 5,220,515 | 6/1993 | Freerks et al. | 364/570 |
| 5,250,135 | 10/1993 | Moss et al. | 117/99 |

FOREIGN PATENT DOCUMENTS

| | | |
|---|---|---|
| 0361171 | 4/1990 | European Pat. Off. . |
| WO-A-91 19017 | 12/1991 | WIPO . |
| WO-A-92 21789 | 12/1992 | WIPO . |

*Primary Examiner*—Marianne Padgett
*Attorney, Agent, or Firm*—Fish & Richardson

[57] ABSTRACT

The flow of a liquid reagent gas into a vapor deposition process chamber is adjusted in response to control information provided by a process controller. The controller executes a prescribed mathematical algorithm which utilizes first and second steady-state pressure differentials. The first pressure differential is measured during the flowing of a carrier gas into the chamber. The second pressure differential is measured after the release of the liquid reagent into the chamber.

9 Claims, 3 Drawing Sheets

METHOD FOR IN-SITU LIQUID FLOW RATE ESTIMATION AND VERIFICATION

BACKGROUND OF THE DISCLOSURE

1. Field of the Invention

This present invention relates generally to controlling the flow rate of a process gas into the reaction chamber of a processing system and, in particular, to an in-situ method for the estimation and verification of a liquid flow controller which is used to deliver liquid chemical precursors for semiconductor processing.

2. Description of Related Art

During a wafer fabrication process, the deposition formation rate on the wafer and the etching removal rate from the wafer depend on the input flow rate of the process gases and the pressure of the process gases in the chamber encapsulating the wafer. Changes in input flow rate of the gases create changes in chamber pressure.

A typical liquid delivery system for a chemical vapor deposition process includes: a liquid precursor controlled by a liquid mass flow controller to deliver the precursor to a vaporization device at a steady flow rate; a carrier gas, controlled by a flow controller, also delivered to the vaporization device for mixing with the vaporized precursor; and one or more other process gases, controlled by flow controllers, delivered along with the carrier gas-vaporized precursor mixture to a reaction chamber. The liquid mass flow controller is controlled by a voltage signal, and oftentimes the factory calibration of the relation between the voltage signal and the flow rate is only approximate, with a tolerance up to 10% being acceptable. Accordingly, the in-situ flow rate must be adjusted to account for the imprecise calibration so as to produce wafers with the required uniformity.

An in-situ estimation and verification methodology to provide a compensated flow rate has been disclosed in U.S. Pat. No. 5,220,515. This procedure is based upon relating the actual liquid flow rate to chamber pressure by comparing the flow rate of the process gas with a known flow rate of a verification gas. The comparison relies upon the determination of the rate of change of both the verification gas pressure and process gas pressure, and ultimately a computation of the flow rate of the process gas into the chamber is expressed in terms of the flow rate of the verification gas and the rate of change of the pressures. Such a technique is complex and somewhat unwieldy because the computations rely upon effects occurring during transient behavior; computing derivatives of real data poses inherent difficulties, especially during transient periods, because of measurement inaccuracies and the data is typically corrupted by noise.

Moreover, the art is devoid of teachings or suggestions of how to compensate the flow rate of a liquid mass flow controller for a liquid precursor.

SUMMARY OF THE INVENTION

These shortcomings as well as other limitations and deficiencies are obviated, in accordance with our invention, by utilizing steady-state pressure measurements and using the results of these measurements to control a liquid flow rate of a liquid precursor released into a vapor deposition system.

Broadly, the system includes: a vapor deposition process chamber; a flow rate controller for delivering the vapor of the liquid precursor to the chamber; and a process controller coupled to the chamber, with the flow rate controller being responsive to the process controller to establish the liquid flow rate. The carrier gas is released into the chamber, and a first steady-state pressure differential is measured. The liquid precursor is then released for delivery, and a second steady-state pressure differential is measured. A prescribed mathematical algorithm is executed by the process controller to generate control information; the algorithm includes a mathematical relationship which utilizes the first and second pressure differentials. The flow rate controller is adjusted in correspondence to the control information.

Our invention has the advantages of: in-situ calibration and verification of the liquid mass flow controller for hazardous liquids; steady-state pressure is used which can be accurately measured; the methodology is independent of chamber volume; multiple sampling techniques are readily accomplished to reduce measurement errors; the methodology is automatic; the procedure is effective for either a single carrier gas or for a carrier gas plus other gases; and the technique can be used for gas mass flow controller calibration and verification as well.

DETAILED DESCRIPTION

Figure 1:
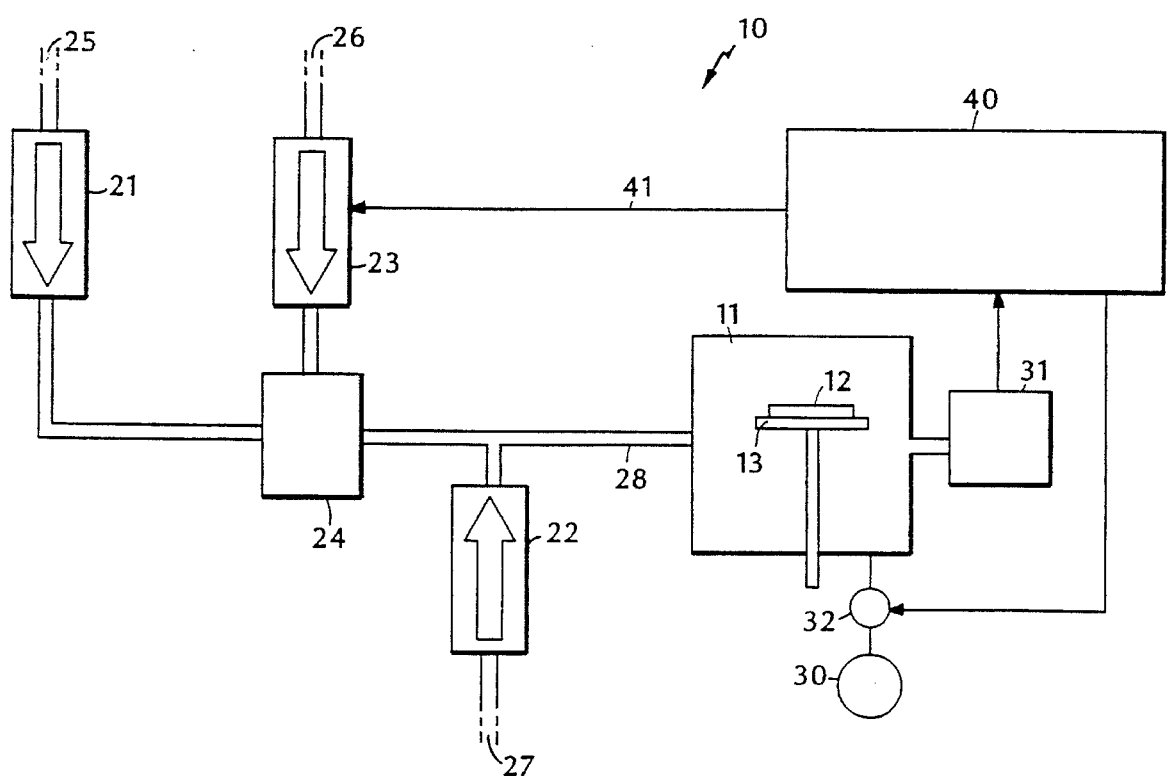
FIG. 1 is a block diagram of a wafer processing system showing the calibration and verification arrangement in accordance with the present invention.

Reference is made to FIG. 1 to describe the structure and operation of a conventional wafer fabrication system. This description is then followed by an elucidation of the in-situ estimation and verification method which may then be utilized in conjunction with this wafer system to engender accuracy and repeatability of flow rate controls, thereby yielding wafer uniformity during fabrication—both wafer-to-wafer and within each particular wafer.

ILLUSTRATIVE EMBODIMENT

In FIG. 1, a semiconductor wafer processing system 10 includes: a reaction chamber 11 for containing a wafer 12 during processing, this wafer being placed on a susceptor 13; a process controller 40; a vacuum pump 30, and an associated pressure servo 32, including an internal throttle, for controlling the pressure within the chamber 11 during processing as measured by a pressure sensor 31—the sensor 31 sends its measurements to the controller 40 and, in turn, the controller 40 operates the pressure servo 32; one or more process gases, such as a carrier gas 25 and other gas(es) 27, and the associated flow controllers exemplified by the controllers 21 and 22, respectively; and a liquid mass flow controller 23 for delivering a liquid precursor 26 to a vaporization device 24. The vaporization device 24 has as inputs the gas 25 as delivered by the flow controller 21 and the liquid precursor 26 as delivered by the flow controller 23. The output of the vaporization device 24 is merged with the gas 27 delivered by the controller 22 and the combined mixture is delivered to the chamber 11 by the pipe 28. The controller 40 communicates with the liquid mass flow controller over bus 41.

The vacuum pump 30 may be any suitable device for evacuating the chamber 11 during processing to relieve chamber pressure. The pressure sensor 31 may be any suitable pressure measuring device. The pressure servo 32 may be any suitable device for controlling the pressure. Flow controllers 21 or 22 may be any suitable regulation device for maintaining constant flow of gas into the vaporization device 24 or the pipe 28, respectively. The liquid mass flow controller (LMFC) 23 may be any suitable regulation device for maintaining the constant flow of the liquid precursor 26 into the vaporization device 24. The vaporization device 24 is a device for vaporizing the liquid precursor 26 and mixing the vapor with the carrier gas 25 delivered by the controller 21. One such vaporization device forms the subject matter of U.S. patent application Ser. No. 07/990,755 filed Dec. 15, 1992, entitled "Vaporizing Reactant Liquids for Chemical Vapor Deposition Film Processing", which is assigned to the same assignee as the present application; the disclosure of this patent application is incorporated herein by reference.

As alluded to in the Background Section, LMFC 23 is pre-calibrated during its factory production, but the pre-calibration accuracy is typically only within 10% of the required calibration curve. To describe the full import of such a gross calibration, reference is made to the graph 200 of FIG. 2, which shows a desired or an expected response curve 201 of flow rate versus voltage applied to control LMFC 23, as well as an actual response curve 202 of flow rate versus voltage resulting from the calibration procedure. Curve 202 represents the +10% extreme in calibration tolerance. (Curve 203 depicts the other extreme of −10%, but need not be discussed any further since the discussion with respect to curve 202 holds, by analogy, to curve 203.) Without loss of generality, it is presumed that the flow rate and the applied voltage are in one-to-one correspondence for the expected curve 201, that is, the slope of curve 201 is 1.0 Thus, because of the +10% calibration imprecision, curve 202 has a slope of 1.1. To illustrate the full impact of the deviation of the actual curve 202 from the expected curve 201, consider the illustrative values that result from applying a voltage (Ve) of 1.0 volts to LMFC 23. It is expected that a flow rate of 1.0 should result; however, the flow rate is actually 1.1, corresponding to an actual voltage of 1.1. In order to have a flow rate of 1.0 from the LMFC 23 as calibrated, the applied voltage must be 1/1.1, or approximately 0.90909 (Va) volts. To account for the deviation between expected and actual flow rates, a correction factor C is introduced and is defined by C=Ve/Va. In this example, C=1.1. Presuming that the value of C can be determined (which is the focus of the present invention), then it becomes feasible to adjust the applied voltage to compensate for the pre-calibration inaccuracy. As is apparent in the example, an actual voltage of Va=Ve/C is then applied to LMFC 23, resulting in an actual flow rate equal to the expected flow rate. It also follows from the definition of the correction factor C and the interrelation between curves 201 and 202 that C may also be obtained from the ratio C=Qa/Qe, where Qe is the expected flow rate for a given applied voltage, and Qa is the actual flow rate for the same applied voltage.

BASIS OF METHODOLOGY

Based upon both a theoretical derivation and experimental observations, the actual liquid mass flow rate, designated Qa, required of the liquid mass flow controller 23 relates to steady-state pressures in the chamber 11 by the equation $$Qa = K(R + Ro), \quad (1)$$

where: R is a pressure ratio obtained from the relation $$R = \frac{(P2 - P1)}{(P1 - P0)} \; ;$$

Figure 3:
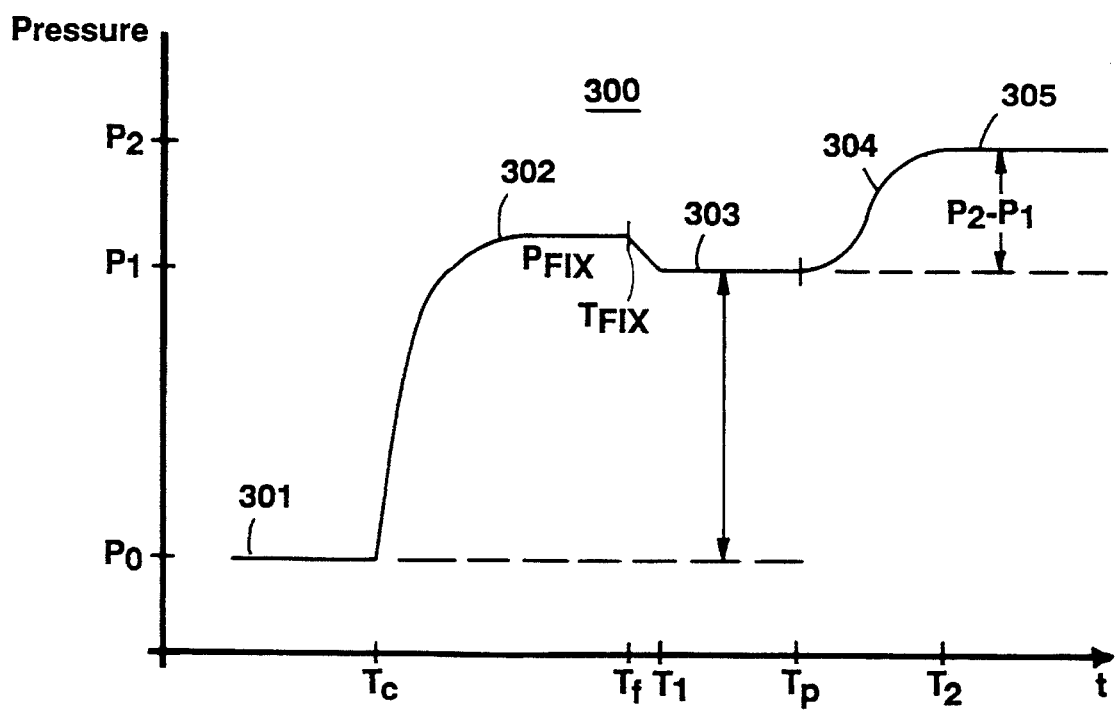
FIG. 3 illustrates a pressure versus time diagram for the pressure in the wafer processing chamber as various gases and the liquid precursor are introduced into the system.

K is a proportionality constant; Ro is a pressure ratio offset (both K and Ro are dependent upon the liquid properties of the precursor 26, the volume of the chamber 11, and the setting of the pressure servo device 32); P0 is a base pressure (arbitrary) of the chamber 11; P1 is the steady-state pressure of the chamber 11 by flowing the carrier gas 25 only; and P2 is the steady-state pressure of the chamber 11 by flowing the carder gas 25 and the vaporized liquid precursor 26. The various pressures P0, P1, and P2 may be described with reference to the pressure versus time plot 300 of FIG. 3. As depicted by FIG. 3, the chamber 11 has an arbitrary, steady-state base pressure P0 represented by the straight line 301 in the time interval 0<t<Tc. At time Tc, the flow controllers 21, 22, ..., associated with the carrier gas 25 and the other gas(es) 27, are set to nominal values, and the carrier gas and the other gas(es) 27 are released. A steady-state pressure (Pfix) is attained in the region 302 by allowing the pressure servo 32 to operate in its servoing mode using its internal throttle. The internal throttle of pressure servo 32 is then set to a fixed value Tfix at time Tf. This fixed value Tfix is determined within the controller 40 as being in the range attained by the pressure servo 32 while in its servoing mode. After a settling period during Tf<t<T1, a steady-state pressure P1 is reached, as denoted by straight line 303 in the interval T1<t<Tp. At time Tp, the precursor is released by controlling LMFC 23 with the expected voltage Ve, that is, there is no correction (or equivalently, C is assumed to be 1.0 initially). After a transient period represented by the region 304 in the interval Tp<t<T2, another steady-state pressure P2 is attained, as represented by straight line 305 in the interval t>T2. The pressure differences (P2−P1) and (P1−0) are also depicted as occurring in the intervals T1<t<Tp and t>T2, respectively.

By analogy to equation (1), for a given expected flow, denoted Qe, there is an expected pressure ratio, denoted Re, such that $$Qe = K(Re + Ro). \quad (2)$$

Figure 2:
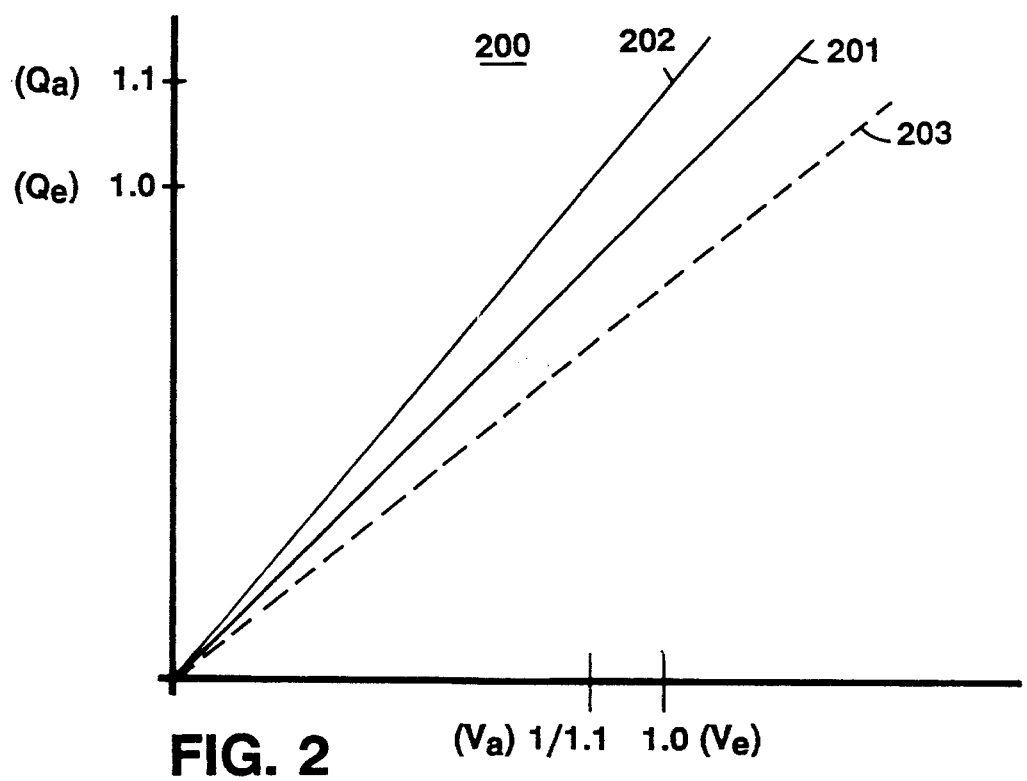
FIG. 2 is a typical factory pre-calibration curve for the liquid mass flow controller showing the flow rate versus applied voltage.

In the foregoing discussion with respect to FIG. 2, the calibration constant C was defined as C=Ve/Va; moreover, as established in the discussion pertaining to FIG. 2, another way of expressing C is C=Qa/Qe, and by utilizing equations (1) and (2), $$C = \frac{(R + Ro)}{(Re + Ro)} \; . \quad (3)$$

Note that K, the constant of proportionality, is eliminated from consideration because of the division operation. Therefore, as set forth by equation (3), only three steady-state pressure ratios are required to compute the correction factor C. Of these three ratios, two ratios, namely, Re and Ro, are determined beforehand as pan of an initialization procedure and, most importantly, these two ratios need to be determined only once for a given liquid precursor in a pre-specified initialization setup; the initialization procedure is effected once and only once for a given chamber.

As an example of such an initialization procedure, consider a process wherein TEOS is the precursor liquid 26 and helium is the carrier gas 25. To obtain Re, two empirical process tests are executed. The first test is a deposition rate test. For the given process, there is a linear relation between the deposition rate and the actual liquid flow rate of the precursor liquid 26. This linear relation is determined during the deposition rate test by flowing the precursor liquid 26 at various flow rates (typically in milligrams/minute) and measuring the corresponding deposition rate (typically in Angstroms/minute). The second test is a pressure test. There is another linear relation between the expected pressure ratio Re and the actual liquid flow rate of the liquid precursor 26. This second linear relation is determined by empirical pressure testing. With reference to FIG. 3, this pressure test phase is executed first, by introducing the carrier gas 25 and measuring P1 to obtain the difference (P1–0) and, second, by introducing the liquid precursor 26 and measuring P2 for the given flow rate to obtain the difference (P2–1). Re is obtained from the ratio (P2–1)/(P1–0). Different values for Re are determined for various actual flow rates. From the two linear relations, since both are in terms of the actual flow rate, it is then possible to derive a linear relationship between deposition rate and Re. Accordingly, for each given deposition rate, there is an associated empirical Re. For example, flowing 500 mgm of TEOS for a plasma-enhanced chemical vapor deposition process (with all other parameters being constant) will yield a ratio Re=0.33 for a deposition rate of 8000 Angstroms/min. Thus, a properly calibrated liquid mass flow controller 23 should match Re=0.33 and the 8000 Angstroms/min. rate. Similarly, for a flow of 550 mgm, a value for Re is 0.355.

To obtain Ro, the empirical data determined for Re may be used in conjunction with equation (2) to further obtain the following two expressions:

$$Qa = 500 \text{ mgm} = K(0.330 + Ro), \text{ and}$$

$$Qa = 550 \text{ mgm} = K(0.355 + Ro).$$

Solving these two expressions for Ro yields Ro=−0.08.

ESTIMATION AND VERIFICATION PROCEDURE

Figure 4:
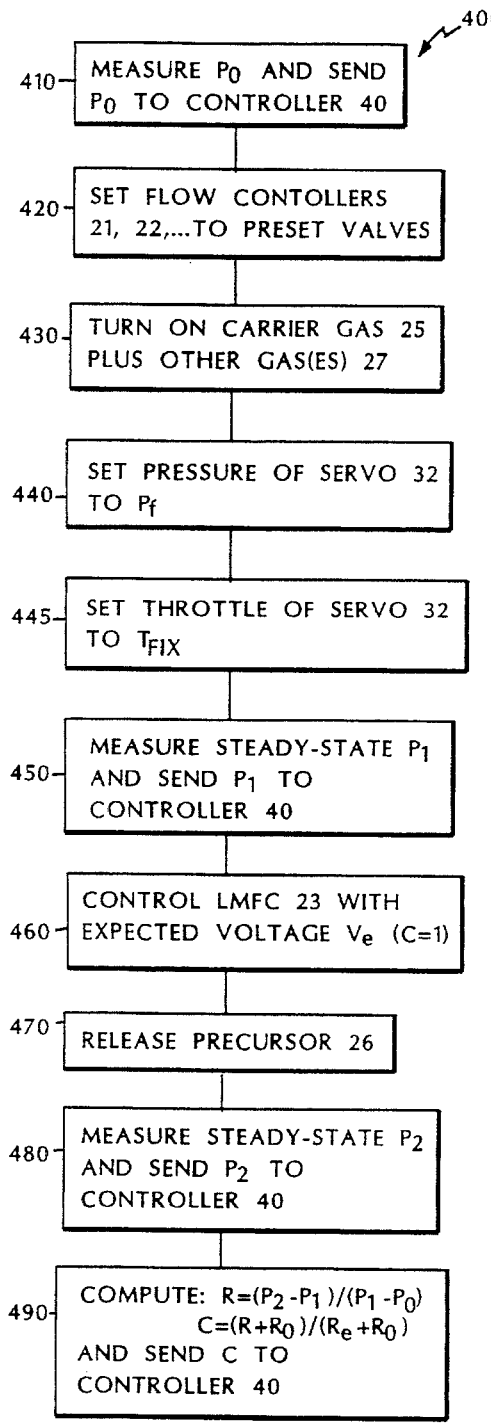
FIG. 4 is a block diagram for the calibration procedure to determine the correction factor to be applied to the liquid mass flow controller to produce a desired flow rate.
Figure 5:
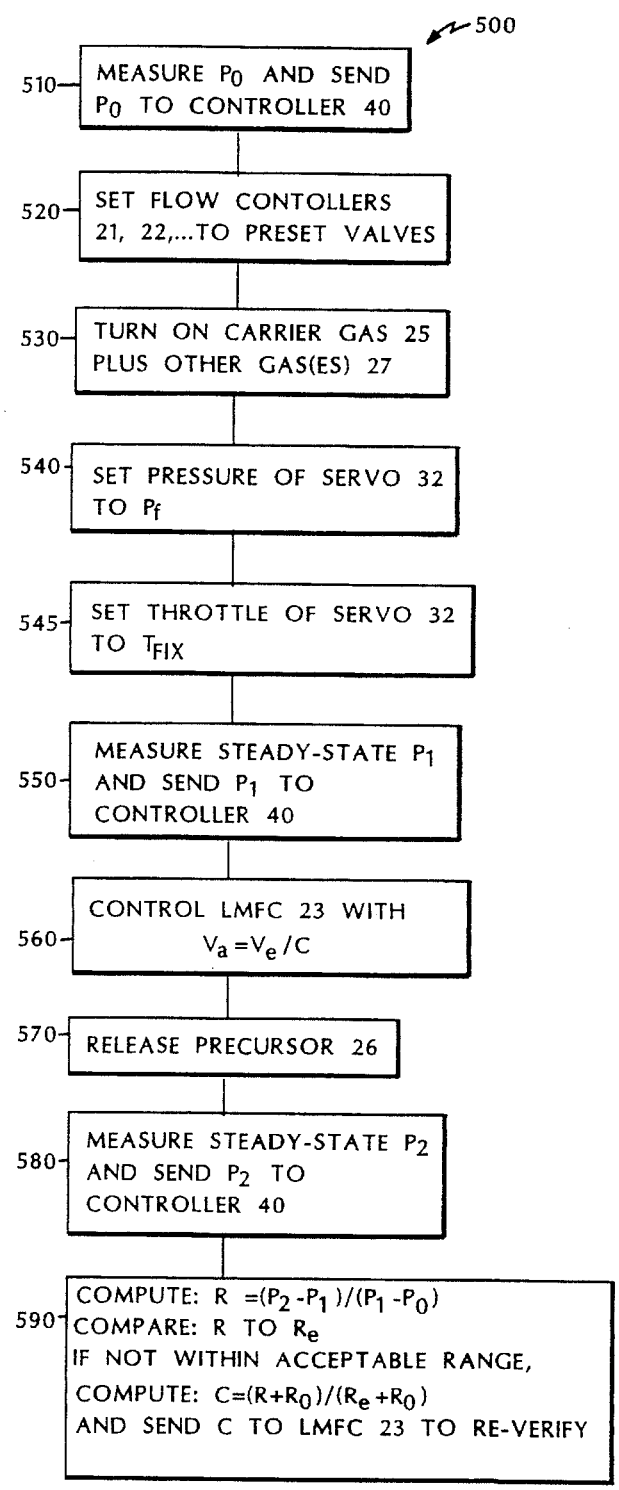
FIG. 5 is a block diagram for the verification procedure to ensure the correction factor obtained produces the desired flow rate of the liquid precursor.

The desired operation of LMFC 23 involves two separate series of steps carried out by a process controller 40 in FIG. 1; controller 40 operates cooperatively with conventional system 10 to improve the production of wafers by processing pressure measurements from the pressure sensor 31 to generate the correction factor C and by providing a control signal indicative of C to LMFC 23 via control bus 41. The first series of steps, called the estimation series and described with reference to FIG. 4, is accomplished by issuing a first voltage control command to LMFC 23 via bus 41 such that no correction factor C is utilized for compensation, that is, a first voltage (Ve) is provided to LMFC 23 which causes the flow of liquid precursor to follow the actual flow rate curve 202 of FIG. 2; the outcome of the estimation series is an estimate to the constant of proportionality C. The second series of steps, called the verification series and described with reference to FIG. 5, is accomplished by the controller 40 issuing a second voltage control command to LMFC 23 so that the voltage (Va) now used to control the LMFC 23 utilizes the correction factor C to adjust the first voltage, that is, Va=Ve/C, so that the flow of the precursor 26 now comports with curve 201 of FIG. 2.

As an adjunct to the estimation series, the values of Re and Ro must first be established since the computation of the value for C in the controller 40 utilizes the relation as given by equation (3). The method for obtaining Re and Ro was previously described with reference to a process using TEOS gas; the procedure described is genetic to a general process using other carriers and other processes gases.

ESTIMATION STEPS FOR ESTIMATING THE CORRECTION FACTOR C

The description of the estimation steps is accomplished with reference to the block diagram 400 of FIG. 4; the function of each block is as follows:
1.) Block 410—determine the steady-state base pressure P0 as measured by pressure sensor 31 and send the value of P0 to controller 40; (in FIG. 3, occurs for 0<t<Tc);
2.) Block 420—set flow controller 21 of the carrier gas 25 to a preset, nominal value and, if other gas 27 is used in the processing, also set flow controller 22 to a preset, nominal value;
3.) Block 430—turn on the gases 25 and 27 for flow to the chamber 11; (in FIG. 3, occurs at Tc);
4.) Block 440—set the pressure servo 32 to a fixed pressure, designated Pfix; (in FIG. 3, occurs at Tc);
5.) Block 445—when steady pressure achieved, set the throttle of pressure servo 32 to a fixed value Tfix; (in FIG. 3, occurs at Tf);
6.) Block 450—upon attaining a steady-state pressure within chamber 11 as monitored by pressure sensor 31, measure the steady-state pressure P1 and send the value of P1 to controller 40; (in FIG. 3, occurs for T1<t<Tp);
7.) Block 460—provide the expected voltage Ve to LMFC 23 from the controller 40 so that liquid precursor 26 flows at a rate corresponding to the precalibration curve 202 of FIG. 2, that is, no correction is applied (in effect, C=1);
8.) Block 470—release the liquid precursor 26 so that the vapor of precursor 26 is mixed with the carrier gas 25 and other gas(es) 27, if any, for delivery to chamber 11; (in FIG. 3, occurs at Tp);
9.) Block 480—upon attaining a steady-state pressure within chamber 11 as monitored by pressure sensor 31, measure the steady-state pressure P2 and send the value of P2 to controller 40; (in FIG. 3, occurs for t>T2); and
10.) Block 490—compute R=(P2−P1)/(P1−P0) and C=(R+Ro)/(Re+Ro) in the controller 40 and provide a signal indicative of C to LMFC 23 via bus 41.

VERIFICATION STEPS FOR VERIFYING THE CORRECTION FACTOR C

The description of the verification steps is accomplished with reference to the block diagram 500 of FIG. 5; the function of each block is as follows:
1.) Block 510—determine the steady-state base pressure P0' as measured by pressure sensor 31 and send the value of P0' to controller 40;
2.) Block 520—set flow controller 21 of the carrier gas 25 to a preset value and, if other gas 27 is used in the processing, also set flow controller 22 to a preset value;
3.) Block 530—turn on the gases 25 and 27 for flow to the chamber 11;
4.) Block 540—set the pressure servo 32 to a fixed pressure, designated Pfix;
5.) Block 545—when steady pressure achieved, set the throttle of pressure servo 32 to a fixed value Tfix;
6.) Block 550—upon attaining a steady-state pressure within chamber 11 as monitored by pressure sensor 31, measure the steady-state pressure P1' and send the value of P1' to controller 40;

7.) Block 560—provide the actual voltage Va=Ve/C to LMFC 23 from the controller 40 so that liquid precursor 26 flows at the Qe flow rate;

8.) Block 570—release the liquid precursor 26 so that the vapor of precursor 26 is mixed with the carrier gas 25 and other gas(es) 27, if any, for delivery to chamber 11;

9.) Block 580—upon attaining a steady-state pressure within chamber 11 as monitored by pressure sensor 31, measure the steady-state pressure P2' and send the value of P2' to controller 40; and 10.) Block 590—compute R'=(P2'−P1')/(P1'−P0), and compare R' to Re; if they are not equal within a given tolerance, then compute a new correction factor or current comparison value C'=(R'+Ro)/(Re+Ro) in the controller 40 and provide a signal indicative of C' to LMFC 23 via bus 41 to resequence through the verification series of steps.

To gain additional insight into the measurement and computation procedure, the numerical example presented earlier for the TEOS process is now completed. An illustrative value for (P2−1) is 1.0 on a normalized basis, wherein a corresponding value for (P1−0) is 2.78, also on a normalized basis. Thus, R=0.36. Recall Re=0.33 and Ro=−0.08, so C=(0.36−0.08)/(0.33−0.08)=1.12. Accordingly, the next control voltage applied to LMFC 23 is the previous value divided by 1.12, or approximately 0.89 times the previous value. In the verification series of steps, (P1'−0) remains unaffected by the new voltage applied to the LMFC 23, but (P2'−1') drops to 0.9295. Then R'=0.33, or R'=Re, thus verifying a proper estimation of the correction factor C.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims.

The invention illustratively disclosed herein may be practiced without any element which is not specifically disclosed herein.

We claim:

1. A method of controlling a liquid mass flow rate of a liquid reagent into a vapor deposition process chamber, the method comprising:

flowing a carrier gas into the chamber;

measuring a first steady-state pressure of the chamber with the carrier gas flowing into the chamber;

flowing the liquid reagent into the flow of carrier gas for delivery of the liquid reagent into the chamber in a vaporized state;

measuring a second steady-state pressure of the chamber while the carrier gas is delivering the vaporized liquid reagent to the chamber;

computing control information from the first and second steady-state pressures; and controlling the liquid mass flow rate of the liquid reagent in response to the control information.

2. The method of claim 1 further comprising:

establishing a base pressure in the process chamber prior to flowing said carrier gas into the chamber; and after establishing a base pressure in said chamber, measuring said base pressure, wherein the computing step comprises using the measured base pressure and the first and second steady-state pressures to compute said control information.

3. The method of claim 2 wherein the computing step comprises:

determining a pressure ratio, R, by computing $$\frac{(P2-P1)}{(P1-P0)},$$

where P0 is the measured base pressure, P1 is the first steady-state pressure, and P2 is the second steady-state pressure;

using R to compute a calibration constant, C; and using C to generate the control information.

4. The method of claim 3 wherein the step of using R to compute the calibration constant, C, comprises calculating $$\frac{(R+Ro)}{(Re+Ro)},$$

wherein Ro is a pressure ratio offset and Re is an expected pressure ratio.

5. The method of claim 4 further comprising determining Ro and Re during an initialization procedure that is performed using said deposition chamber prior to performing the aforementioned steps.

6. The method of claim 5 wherein the step of determining Ro comprises:

determining a first pressure ratio, Re1, for a first liquid mass flow rate, Q1, of said liquid reagent into process chamber in a vaporized state;

determining a second pressure ratio, Re2, for a second liquid mass flow rate, Q2, of said liquid reagent into the process chamber in a vaporized state; and computing Ro from the following relationship:

$$\frac{Q1}{Q2} = \frac{(Re1+Ro)}{(Re2+Ro)}.$$

7. The method of claim 3 wherein the computing step comprises:

determining a pressure ratio, R, by computing $$\frac{(P2-P1)}{(P1-P0)},$$

where P0 is the first steady-state pressure, P1 is the second steady-state pressure, and P2 is the third steady-state pressure; and comparing R to an expected pressure ratio, Re; wherein the controlling step comprises adjusting the liquid mass flow rate if R deviates from Re by more than a predetermined threshold amount.

8. The method of claim 7 wherein the controlling step further comprises refraining from adjusting the liquid mass flow rate if R deviates from Re by less than the predetermined threshold amount.

9. The method of claim 1 wherein the step of flowing the liquid reagent into the flowing carrier gas for delivery of the liquid reagent into the chamber in a vaporized state comprises:

flowing the liquid reagent into a vaporizer;

within the vaporizer, using the flowing carrier gas to vaporize the liquid reagent that is flowed into the vaporizer; and supplying the vaporized liquid reagent to the chamber.

* * * * *